(12) United States Patent
Alers et al.

(10) Patent No.: US 7,994,640 B1
(45) Date of Patent: Aug. 9, 2011

(54) NANOPARTICLE CAP LAYER

(75) Inventors: Glenn Alers, Scotts Valley, CA (US);
Robert H. Havemann, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 322 days.

(21) Appl. No.: 11/772,784

(22) Filed: Jul. 2, 2007

(51) Int. Cl.
*H01L 23/48* (2006.01)
(52) U.S. Cl. ......... 257/767; 257/741; 257/503; 257/508
(58) Field of Classification Search .................. 257/210, 257/211, 503, 208, 741, 767, E21.497
See application file for complete search history.

(56) References Cited

U.S. PATENT DOCUMENTS

| | | | |
|---|---|---|---|
| 5,695,810 A * | 12/1997 | Dubin et al. ................... | 438/643 |
| 6,153,519 A | 11/2000 | Jain et al. | |
| 6,323,131 B1 | 11/2001 | Obeng et al. | |
| 6,342,733 B1 * | 1/2002 | Hu et al. ....................... | 257/750 |
| 6,753,248 B1 | 6/2004 | Wood et al. | |
| 6,844,258 B1 | 1/2005 | Fair et al. | |
| 6,899,816 B2 * | 5/2005 | Padhi et al. ..................... | 216/52 |
| 7,157,798 B1 | 1/2007 | Fair et al. | |
| 7,256,466 B2 * | 8/2007 | Lieber et al. ................... | 257/414 |
| 2004/0105934 A1 | 6/2004 | Chang et al. | |
| 2004/0127001 A1 * | 7/2004 | Colburn et al. ............... | 438/586 |
| 2004/0175631 A1 | 9/2004 | Crocker et al. | |
| 2005/0129843 A1 | 6/2005 | Wu et al. | |
| 2006/0108320 A1 * | 5/2006 | Lazovsky et al. ................. | 216/2 |
| 2006/0118921 A1 | 6/2006 | Lin et al. | |
| 2006/0189113 A1 | 8/2006 | Vanheusden et al. | |
| 2006/0254503 A1 * | 11/2006 | Dai et al. ......................... | 117/84 |
| 2006/0254504 A1 * | 11/2006 | Dai et al. ......................... | 117/84 |
| 2006/0292846 A1 | 12/2006 | Pinto et al. | |
| 2008/0067679 A1 * | 3/2008 | Takagi et al. ................. | 257/751 |

FOREIGN PATENT DOCUMENTS

WO    2006/124769    11/2006

OTHER PUBLICATIONS

C.-K. Hua L. M. Gignac, R. Rosenberg, B. Herbst, S. Smith, J. Rubino, and D. Canaperi,S. T. Chen, S. C. Seo, and D. Restaino, Appl Phys. Lett. 84(24) 4986 (2004).
V. Pardo-Yissar, E. Katz, O. Lioubashevski, I. WIlner, Langmuir 2001, 17, 1110.
M., Chirea, V. Garcia-Morales, J. A. Manzanares, C.Pereira, R. Gulaboski, F. Silva, J. Phys. Chem. B 2005, 109, 21808.
C. G. Zimmermann,1,2 M. Yeadon, K. Nordlund, J. M. Gibson, and R. S. Averback, Phys. Rev. Lett. 83(6) 1163 (1999).
L. F. Cao, 1, G. Y. Xu, D. Xie, M. X. Guo, L. Luo, Z. Li, and M. P. Wang, Phys. Stat. Sol. (b) 243, 12, 2745-2755 (2006).
S. Chen, R. W. Murray, J. Phys. Chem. B 1999, 103, 9996.

(Continued)

*Primary Examiner* — Leonardo Andújar
*Assistant Examiner* — Jordan Klein
(74) *Attorney, Agent, or Firm* — Weaver Austin Villeneuve & Sampson LLP

(57) ABSTRACT

Functionalized nanoparticles are deposited on metal lines inlaid in dielectric to form a metal cap layer that reduces electromigration in the metal line. The functionalized nanoparticles are deposited onto activated metal surfaces, then sintered and annealed to remove the functional agents leaving behind a continuous capping layer. The resulting cap layer is about 1 to 10 nm thick with 30-100% atomic of the nanoparticle material. Various semiconductor processing tools may be adapted for this deposition process without adding footprint in the semiconductor fabrication plant.

17 Claims, 5 Drawing Sheets

OTHER PUBLICATIONS

W. Chen, J. R. Davies, D. Ghosh, M. C. Tong, J. R. Konopelski, S. Chen, Chem. Mater. 2006, 18, 5253.

D.K. Lee, Y.H. Kim, X.L. Zhang, Y.S. Kang, Current Applied Physics 2006, 6, 786.

G.J. Cheng, D. Romero, G.T. Fraser, A.R.H. Walker, Langmuir 2005, 21, 12055.

Tsai, et al., "Metalorganic chemical vapor deposition of tungsten nitride for advanced metallization", Appl. Phys. Lett. 68 (10), Mar. 4, 1996, pp. 1412-1414.

Becker et al., "Highly Conformal Thin Films of Tungsten Nitride Prepared by Atomic Layer Deposition from a Novel Precursor", Chem. Mater. 2003, 15, 2969-2976.

Chiu et al., "Tungsten nitride thin films prepared by MOCVD", J. Mater. Res., vol. 8, No. 6, Jun. 1993, pp. 1353-1360.

Crane et al., "Kinetic and Mechanistic Studies of the Chemical Vapor Deposition of Tungsten Nitride from Bis (Tertbutylimido) Bis (Tertbutylamido) Tungsten", J. Phys. Chem. B 2001, 105, 3549-3556.

Wu et al., Surface reaction of bis (tertbutylimido) bis (diethylamido) tungsten precursor on Si(100)—(2X1), J. Vac. Sci. Technol. A 21(5), Sep./Oct. 2003, pp. 1620-1624.

Kim et al., "Characteristics of Tungsten Carbide Films Prepared by Plasma-Assisted ALD Using Bis(tert-butylimido)bis(dimethylamido) tungsten", Journal of The Electrochemical Society, 150 (10) C740-C744 (2003).

Becker et al., "Diffusion barrier properties of tungsten nitride films grown by atomic layer deposition from bis (tert-butylimido)bis(dimethylamido) tungsten and ammonia", Applied Physics Letters, vol. 82, No. 14, Apr. 7, 2003, pp. 2239-2241.

U.S. Appl. No. 12/044,918, "Selective Capping of Copper with Ruthenium", Alers et al., filed Mar. 7, 2008.

U.S. Appl. No. 10/984,126, Office Action mailed Nov. 23, 2005.

U.S. Appl. No. 10/984,126, Office Action mailed May 17, 2006.

U.S. Appl. No. 10/984,126, Notice of Allowance mailed Aug. 25, 2006.

U.S. Appl. No. 10/984,126, Allowed Claims.

U.S. Appl. No. 11/772,767, "Nanoparticle Cap Layer", Alers et al., filed Jul. 2, 2007.

U.S. Appl. No. 11/772,773, "Nanoparticle Cap Layer", Alers et al., filed Jul. 2, 2007.

U.S. Appl. No. 11/506,761, "Selective Capping of Copper", Alers et al., filed Aug. 18, 2006.

U.S. Appl. No. 11/506,761, Office Action mailed Aug. 26, 2008.

U.S. Appl. No. 11/506,761, Office Action mailed Feb. 24, 2009.

U.S. Appl. No. 12/044,918, Office Action mailed Jun. 22, 2009.

Kwon, Oh-Kyum et al., "PEALD of a Ruthenium Adhesion Layer for Copper Interconnects", Journal of The Electrochemical Society, 151 (12) C753-C756 (2004).

Aloha Electronics, Aloha CVD/ALD Materials.

U.S. Appl. No. 11/506,761, Office Action mailed Jan. 6, 2010.

U.S. Appl. No. 12/044,918, Office Action mailed Jan. 25, 2010.

U.S. Appl. No. 11/506,761, Office Action mailed Apr. 8, 2010.

U.S. Appl. No. 11/772,767, Office Action mailed Sep. 22, 2010.

U.S. Appl. No. 11/772,773, Office Action mailed Sep. 29, 2010.

U.S. Appl. No. 11/772,773, Office Action mailed Jan. 11, 2011.

* cited by examiner

US 7,994,640 B1

NANOPARTICLE CAP LAYER

FIELD OF INVENTION

The present invention pertains to methods and apparatus used in device fabrication processes, and more particularly to methods and apparatus used to deposit material onto a semiconductor substrate. The methods and apparatus are particularly useful for forming a metal cap layer on top of embedded metal lines.

BACKGROUND OF THE INVENTION

Electromigration reliability is a serious concern for interconnects. Electromigration is an atomic-scale phenomenon in which the moving electrons that constitute electric-current collide with the metal-atoms of an interconnect line and push them in the direction of the current flow. Given enough collisions over time, a significant migration of the metal atoms will occur. This transport of material can lead to formation of voids and consequent increase in resistance, and ultimately lead to the electrical failure of the interconnect by breaking the line. Electromigration defects occur principally at interfaces between metal lines and overlying dielectric layers. In damascene interconnects, this is frequently the interface between copper and an etch stop/diffusion barrier layer of silicon nitride, silicon carbide or other dielectric capping layer.

As integrated circuit technology reduces to the 45 nm node and below, interconnect dimensions are being reduced without a corresponding reduction in the drive current. This puts a great deal of pressure on device designers to address the increased current density requirements. The problem is exacerbated because the critical void size for interconnect failures scales with the dimensions and further reduces reliability. One solution to improve electromigration reliability is to cap the top copper surface with a metal layer that has a greater resistance to electromigration than the copper. The cap layer can impede electromigration in two ways. First, it may adhere better to the copper than the dielectric barrier. Second, if the sheet resistance of the cap layer is low enough then it can provide a shunting layer near the contact, thereby mitigating the effect of any voids that form in the copper interconnect.

A metal cap layer may also supplement the barrier properties of the overlying etch stop layer deposited at the interface with the dielectric layer of the next higher metallization layer. In particular, depending on the composition and deposition technique used to form the metal capping layer, such layer may afford some independent protection against copper diffusion from metal lines to the dielectric in an overlying layer.

It would be desirable to have improved processes for depositing metal cap layers.

SUMMARY OF THE INVENTION

In certain embodiments, a metal cap layer is formed by depositing functionalized nanoparticles on metal lines embedded in a dielectric layer. As with prior cap layers, a purpose of the cap layer is to reduce electromigration in the metal lines. The functionalized nanoparticles typically include small metal cores that have been "functionalized" with one or more chemical moieties (sometimes referred to as ligands or functional agents herein) to impart a particular chemical property; e.g., affinity for copper lines. In some cases, the functionalized nanoparticles are deposited onto activated metal surfaces, and then sintered to remove the functional agents. The resulting structure is optionally treated (e.g., annealed) to form a "composite" cap layer that includes metal from nanoparticles together with metal from the underlying metal line. In some cases, the anneal serves to embed the nanoparticles into the metal lines. In another case the small nanoparticles may melt and wet the copper surface due to the large surface energy of the nanoparticles. The resulting cap layer may be about 0.5 to 50 nm thick with a composition of 30-100% atomic of the metal present in the nanoparticles. In some embodiments, a graded cap layer comprising of entirely metal from the nanoparticles may be formed. Various semiconductor processing tools may be adapted for this deposition process without, in some cases, increasing the footprint of existing tools in the semiconductor fabrication plant.

In one aspect, the present invention pertains to a deposition method to selectively deposit functionalized nanoparticles onto selected regions of a semiconductor substrate and then to remove their functional agents so that a layer of nanoparticles remains on the selected regions. Prior to this selective deposition, the substrate may be planarized with, for example, a CMP process. After the selective deposition and subsequent removal of the functional agents, the substrate may be optionally annealed.

The selectively depositing operation may include a separate surface preparation prior to the actual deposition. The surface preparation operation would serve to modify a surface property of selected regions of the substrate. In one embodiment, the substrate is exposed to a reducing gas or plasma that might, for example, contain hydrogen, nitrogen and/or silane to leave surfaces of selected regions more hydrophilic. Alternatively or in addition to, a portion of the substrate (e.g., the exposed metal) is initially rendered hydrophilic and the dielectric regions are rendered hydrophobic. Then the hydrophilic portion is "activated" to accept the functionalized nanoparticles and the hydrophobic portion will repel the functionalized nanoparticles. Thereafter, a quasi-monolayer of nanoparticles can be selectively deposited by exposing the substrate to functionalized nanoparticles. The functional agents of the functionalized nanoparticles have an affinity for the activated portion of the substrate but not necessarily for one another. Thus, the deposition process may form a quasi monolayer of functionalized nanoparticles only on the activated regions of the substrate. The functionalized nanoparticles in the quasi monolayer adhere to the activated surface but generally not to each other and not to the dielectric surface.

A portion of the substrate may be rendered hydrophilic by depositing a compound that selectively couples to one material of the substrate and presents an exposed hydrophilic moiety. For substrates containing metal and dielectric portions such as copper lines in a dielectric material, suitable compounds include, e.g., carboxylic acid-terminated or ammonium-terminated alkanethiols. The carboxylic acid-terminated or ammonium-terminated alkanethiols may form self-assembled monolayers (SAMs) on the substrate surface by bonding the thiol end to the metal surface. The portion of the substrate surface to which the thiol end bonds may be metal lines, usually copper lines, embedded in dielectric. The carboxylic acid-terminated or ammonium-terminated end of the alkanethiols would point away from the copper surface, thus presenting a locally hydrophilic surface. The alkanethiols would not attach to the dielectric surface, which would remain hydrophilic. In some cases, rendering the surface portion hydrophilic is sufficient to allow selective attachment of the functionalized nanoparticles to the metallic lines and not the dielectric portions.

In certain embodiments, the appropriate portions of the surface may be "activated" by contact with a reagent such as an activating chemical. The activated surface is more susceptible to attachment of functionalized nanoparticles. Such activating reagents may be used alone or combination with some other agent such as a hydrophilic species. In a specific embodiment, a polymeric activating reagent is used to activate the hydrophilic surface of a substrate to form a polymer overlayer that accepts the functionalized nanoparticles. The activating chemical may be, for example, a polyacrylic acid (PAA) or poly-L-lysine (PL). The surface deposited PAA or PL bonds to the ligands of the functionalized nanoparticles, thus forming the quasi monolayer of functionalized nanoparticles discussed above. Alternatively, a PS-PVP diblock copolymer (poly(styrene-b-2-vinylpyridine) can be used. After one quasi monolayer of functionalized nanoparticles is formed, additional layers may be added by reactivating the surface with the activation chemical and redepositing functionalized nanoparticles. This process may be repeated until a sufficient density or effective thickness of functionalized nanoparticles is reached.

After sufficient nanoparticles have been deposited, the wafer may be dried. This process may be applicable to copper, aluminum or tungsten lines, depending on the treatments employed for making the surface hydrophilic and for activating. The nanoparticles may be metal or non-metal. Metal examples include cobalt, ruthenium, nickel, platinum, palladium, gold, tungsten, titanium, titanium nitride or alloys thereof. Dielectric nanoparticles may include aluminum oxide, titanium oxide, silicon carbide and silicon nitride. For certain capping applications, the nanoparticles may be cobalt. For certain applications, the nanoparticles may be ruthenium. The nanoparticles may have average diameters of about 1-10 nm. As an example, the functional agents attached to the nanoparticles may be carboxylic acid-terminated or ammonium-terminated alkanethiols.

After selective deposition, the functional agents, or ligands, are removed from the quasi monolayer or multiple layers by, e.g., exposing the substrate to reducing plasma, radiant energy, e.g., UV light, thermal energy, or a combination of any two or more of these. The exposure breaks the bonds in the functional nanoparticle layers and releases the organic molecules. The resulting gaseous by-product can then be removed. This process is also known as sintering and attaches the nanoparticles to the surface of the selected region and to themselves. One or more quasi monolayers of nanoparticles may result.

The nanoparticles attached to the surface are then optionally annealed to form a cap layer. The annealing operation may drive copper diffusion into the nanoparticle layers and effectively "wet" the nanoparticles. The result is a metal cap layer of nanoparticles intermixed with metal from the selected surface (e.g., copper) at about 20 atomic % or greater of the substrate metal. The resulting metal cap layer may have an effective thickness of about 0.3 to 10 nm, depending on how many layers are deposited, the filling ratio, anneal conditions, etc. In certain embodiments, the nanoparticles might also wet the selected surface at temperatures much less than the melting point of the nanoparticles material due to the high surface energy of the nanoparticles relative to bulk.

In an alternative embodiment, alkanedithiols can instead be used to join a copper surface with the functionalized nanoparticles. Alkanedithiols have two terminal thiol groups: one for copper surface, and one for the transition metal nanoparticles. In such embodiments, no polymer or other activating reagent is necessary.

In yet other alternative embodiments, different compounds may be used to modify the surface properties of the SAM substrate. For example, instead of making the copper surface hydrophilic, the copper surface may be made hydrophobic by using, for example, 1-hexadecanethiol. Additionally, the dielectric surface properties may be modified using the same concept.

In another aspect, the present invention pertains to a semiconductor apparatus. The apparatus may include one or more substrate caches, one or more pretreatment modules, one or more nanoparticle deposition modules, one or more robots to transfer substrates, one or more cleaning modules, and one or more CMP modules. The pretreatment module may include a spin platform for wet pretreatments and/or an enclosed chamber for gas treatments or a chamber for plasma treatment. The deposition module may include with a spin platform and a first deposition mechanism (e.g., a nozzle), and may also include a non-contact cleaner configured to clean a substrate after a polishing operation and a second nozzle to dispense a drying vapor onto the substrate. The first dispensing mechanism may dispense a surface treatment agent, functionalized nanoparticles, and de-ionized water. The surface treatment agent may be, e.g., polyacrylic acid (PAA), poly-L-lysine (PL), benzotriazole (BTA), a carboxylic acid-terminated alkanethiol, an ammonia-terminated alkanethiol or an alkanedithiol. The functionalized nanoparticles may include nanoparticles of cobalt, ruthenium, nickel, platinum, palladium, gold, tungsten, titanium, titanium nitride, or alloys thereof. The semiconductor processing apparatus may also include a controller configured to execute a set of instructions to, e.g., deposit one or more surface treatment agents on a substrate; deposit a layer of functionalized nanoparticles on the substrate; repeat operations (a) and (b) until a desired thickness is reached; and dry the substrate.

In yet another aspect, the present invention pertains to a semiconductor processing apparatus having a sintering and annealing module. The apparatus may include one or more substrate caches, one or more processing chambers, and one or more robots to transfer substrates to and from the caches and the chambers. The sintering and annealing modules may include an enclosed processing chamber for gas treatments or a chamber for plasma treatment, radiation treatment (UV) or thermal treatment. The processing chambers may include a plurality of process stations configured to deposit a dielectric or to remove functional agents from deposited functionalized nanoparticles on a substrate. The process stations may have a controlled-temperature substrate holder, at least one electrode configured to generate a plasma, and at least one gas injection port. The processing chamber may also include one or more process stations with one or more radiant energy generators. The apparatus may also include a controller configured to execute a set of instruction to remove functional agents, anneal the substrate and deposit a dielectric onto the substrate. The instructions may be executed in the same processing chamber or different chambers.

In yet another aspect, the present invention pertains to a semiconductor metallization stack having metal lines of first metal embedded or inlaid in a dielectric and one or more metal cap layers. The first metal cap layer may include the first metal and a second metal. From a top boundary of the metal lines into a level 1-10 nm below the top boundary, the concentration of the first metal is at least about 20% atomic, preferably about 20-70% atomic. A second metal cap layer of the second metal, with insignificant amounts of the first metal, may also be formed by the nanoparticles wetting the surface of the first metal line. The first metal may be copper and the second metal may be a pure metal or a metal alloy. The second metal may be nanoparticles of cobalt, ruthenium, nickel, platinum, palladium, gold, tungsten, titanium, titanium nitride, or alloys thereof. The metal cap layer may include a metal alloy comprising boron, phosphorous, or both, at 0-20% atomic. The nanoparticles may be clusters of about 50-1000 metal atoms and may be about 1-10 nm in size. The metal cap layer may impede electromigration of the first metal to increase the electromigration lifetime of the metal line and act as a shunt around voids formed in the metal line.

The invention may also be more generally applicable in other semiconductor processing contexts. For example, these apparatus and methods may be applicable to any semiconductor process requiring selective deposition of material in small geometries. In certain embodiments, non-metal nanoparticles may be deposited. These and other features and advantages of the present invention will be described in more detail below with reference to the associated drawings.

DETAILED DESCRIPTION

Introduction

Figure 1:
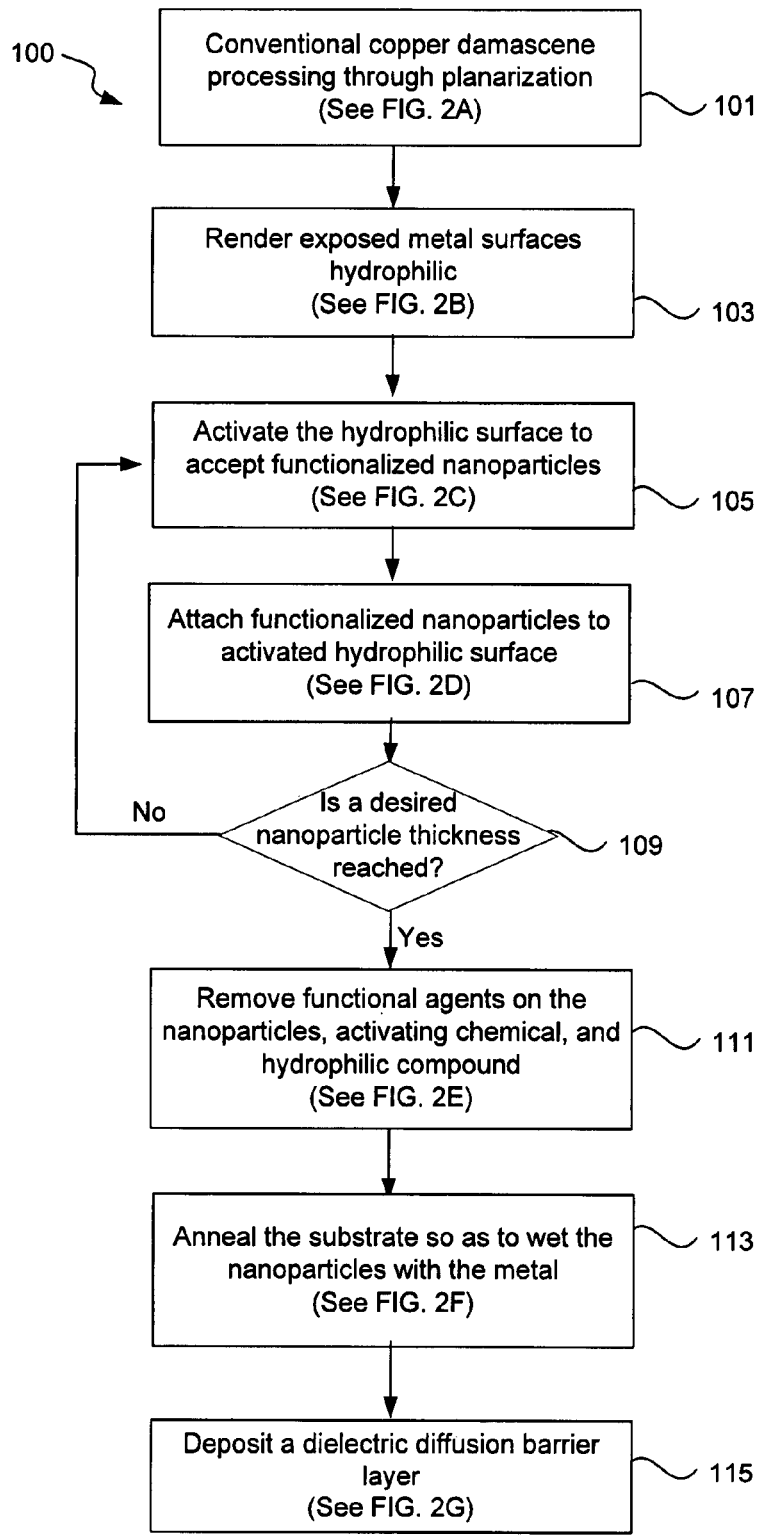
FIG. 1 is a process flow diagram of certain method embodiments in accordance with the present invention.

Embodiments of the present invention are described herein in the context of a metal cap layer on top of copper lines. Those of ordinary skill in the art will realize that the following detailed description of the present invention is illustrative only and is not intended to be in any way limiting. Other embodiments of the present invention will readily suggest themselves to such skilled persons having the benefit of this disclosure. For example, although capping of copper lines is discussed, the selective nanoparticle deposition of a metal cap layer is applicable on other types of metal features (e.g., aluminum interconnects). Further, selective nanoparticle deposition may be appropriate on non-metal surfaces as well.

Reference will be made in detail to implementations of the present invention as illustrated in the accompanying drawings. The same reference indicators will be used throughout the drawings and the following detailed description to refer to the same or like parts. In this application, the terms "work piece," "wafer" and "substrate" will be used interchangeably. The following detailed description assumes the invention is implemented on a wafer. However, the invention is not so limited. The work piece may be of various shapes, sizes, and materials (e.g., displays of various sizes).

As discussed above, a metal cap layer may alleviate the effects of electromigration in a metal interconnect. Many aspects of this invention pertain to the use of nanoparticles to form capping layers. Generally nanoparticles are microscopic particles whose size is measured in nanometers (nm). They may be viewed as particles with at least one dimension less than about 100 nm. Nanoparticles have a very high surface area to volume ratio. This provides a tremendous driving force for diffusion, especially at elevated temperatures greater than room temperature. To facilitate their use in aqueous solutions, nanoparticles may be functionalized with certain organic molecules. The exposed ends of the organic molecules may have affinity for certain features or surfaces and can be used to selectively attach the functionalized nanoparticles. Deposition of functionalized nanoparticles by tailoring the nanoparticle to selectively adhere to surfaces having particular properties may avoid problems such as unintended deposition onto metal contaminants present on dielectric surfaces. A self-assembled monolayer (SAM) or quasi-monolayer of organic molecules can be formed on the exposed metal surfaces. This SAM can then be used to build layers of nanoparticles that are more continuous and uniform than electroless plated metal cap layers of the same thickness.

Process

In accordance with certain embodiments described herein, a selective nanoparticle deposition method forms a metal cap layer that impedes electromigration at the dielectric barrier layer interface. If voids begin to form in the interconnect due to electromigration or other phenomenon, the cap layer may act as a shunt layer for the current to bypass the voids. The cap layer may also serve as a barrier that impedes diffusion of metal atoms to the dielectric layers surrounding the metal lines.

Figure 2A:
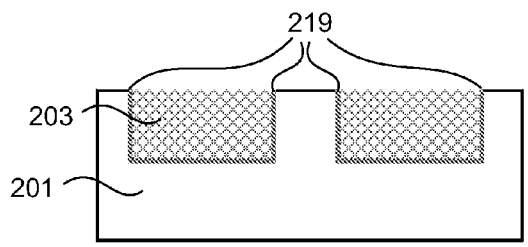
FIGS. 2A-2G illustrates schematically certain operations of the process in FIG. 1.

FIG. 1 is a process flow diagram representing a sequence of operations that may be performed in certain embodiments. In the depicted embodiment, a copper damascene process is used to form a layer of metal inlaid in a dielectric layer, shown as block 101 in FIG. 1. FIG. 2A illustrates a cross section of a metallization layer including metal feature 203 and a surrounding dielectric layer 201. In a damascene process, dielectric layer 201 is first etched with line paths (trenches and vias). A metal diffusion barrier 219 is then deposited to cover the conductive routes. The metal diffusion barrier 219 may be tantalum, tantalum nitride, or other reasonably conductive diffusion barrier material. A metal feature 203 is then deposited, usually copper, by an electroplating process, followed by, e.g., chemical mechanical polishing (CMP) to planarize the substrate surface back down to the dielectric. The metal is thus inlaid in the trenches and vias surrounded by the dielectric layer as shown in FIG. 2A. Note that although the metal features 203 such as metal lines are shown inlaid only on the upper region of dielectric 201, vias (not shown) would typically also be present and extend through the dielectric at various points to contact metal lines of a lower metallization layer or semiconductor devices formed on a substrate.

In some cases, the techniques described herein selectively deposit nanoparticles on particular regions of a substrate, but not others. The selectivity can be accomplished by various techniques. In certain embodiments, the nanoparticle deposition method exploits the hydrophobic/hydrophilic difference of metal (e.g., copper) relative to dielectric. Dielectric materials, especially low k dielectrics, used with electronic devices are often inherently hydrophobic. In certain embodiments, a metal surface can be modified to become more hydrophilic by, e.g., treatment with surface active agent. In a specific embodiment, the metal may be modified by forming a self-aligned monolayer of compounds presenting a hydrophilic surface. One of the many ways to selectively form such self-aligned monolayer on various metals such as copper is to use thiol-containing organic molecules having hydrophilic termini.

For example, a copper surface can be made more hydrophilic by exposing it to carboxylic acid-terminated or ammonium-terminated alkanethiols. See block 103 of FIG. 1. As shown on FIG. 2B, when a substrate containing metal features 203 is contacted with a compound 207 having two terminal functional groups 205 and 209, it may selectively bind to the surface of metal features 203 at the terminal group 205 and expose terminal group 209. For example, thiol terminal group 205 binds to copper feature 203, while a carboxylic acid or the ammonium terminal group 209 points away from the copper. When certain types of two terminal molecules 207 are employed, it is believed that they modify the metal surface in manner such that one end 205 of the molecule binds to the metal and the other end 209 points up and away. The degree to which such self assembly occurs will vary; however, as a whole the modified copper surface will be more hydrophilic.

In certain embodiments, the substrate may be exposed to plasma or forming gas to prepare the surface prior to nanoparticle deposition. A plasma or reducing gas may remove organic contamination from the surface of the substrate and may also render the surface more hydrophilic. Suitable plasma or gas may include hydrogen, nitrogen, and/or silane.

Figure 2E:
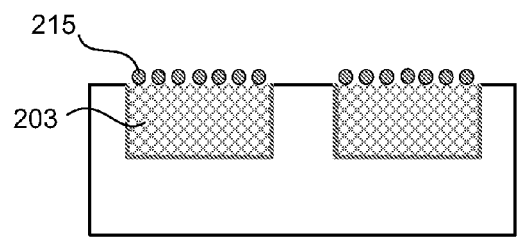
Figure 2B:
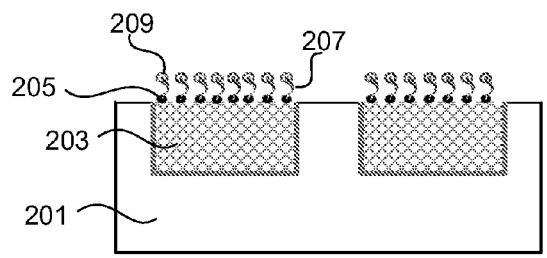
Figure 2F:
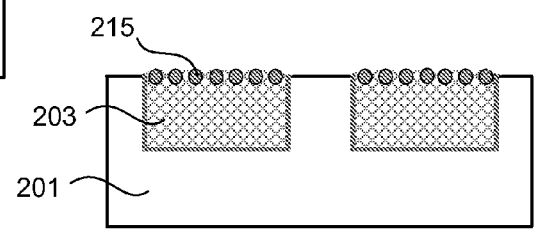
Figure 2C:
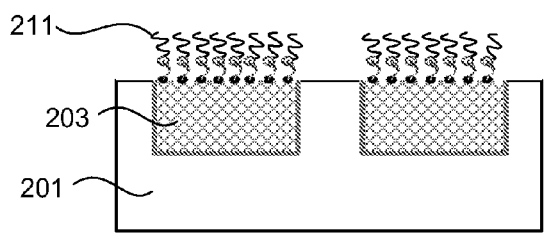

After the metal features have been rendered more hydrophilic in the depicted embodiment, the hydrophilic surface is activated to accept functionalized nanoparticles. See block 105 of FIG. 1. Exposure to an activating chemical 211 may produce an activated surface as shown in FIG. 2C. In one example, poly(acrylic acid) (PAA) or poly-L-lysine (PL) 211 may be used to selectively form a polymer overlayer on top of the exposed hydrophilic terminals 209. Alternatively, a PS-PVP diblock copolymer (poly(styrene-b-2-vinylpyridine) can be used. The activating chemical may bond to the hydrophilic ends by virtue of electrostatic interactions or hydrogen bonding.

As indicated in block 107 of FIG. 1, the functionalized nanoparticles are then attached to the activated hydrophilic surface by exposing the substrate to functionalized nanoparticles, typically provided via liquid medium—e.g., a solution or suspension. The resulting modified surface is depicted in FIG. 2D. As shown, nanoparticles 215 may be functionalized with a functional agent 213 such as carboxylic acid-terminated or ammonium-terminated alkanethiols. The thiol group bonds to the nanoparticle surface while the carboxylic acid or ammonium end would bind to the polymer overlayer 211, forming a quasi monolayer of functionalized nanoparticles. In another example, 1,3-dipolar cycloaddition reactions can be used to bind the nanoparticles to the activated surface.

In a typical embodiment, a nanoparticle size suitable for the depicted selective deposition method may be about 1 to 10 nm, preferably about 2-5 nm. Depending on the type of capping layer being formed, the nanoparticles may be a particular metal, alloy, or metal compound. For example, the nanoparticles may be cobalt, ruthenium, nickel, platinum, palladium, gold, tungsten, or alloys of these. Of these, cobalt is particularly desirable as a metal cap layer material. Similarly, ruthenium may be a desirable cap layer material.

In the resulting quasi monolayer of functionalized nanoparticles, the functional ligands preferentially adhere to the activated surface but not to each other. As a result the quasi monolayer will contain, in its most dense state, a closely packed layer of functionalized nanoparticles (e.g., a hexagonal close packed monolayer). The nanoparticles 215 themselves are typically separated by a distance dictated by their functional ligands. Assuming that the ligands completely sterically hinder the approach of adjacent nanoparticles, the particles will typically be separated by a distance of at least twice the length of the ligand. However, in certain embodiments, the ligands of adjacent nanoparticles may interdigitate with one another to allow the nanoparticles to more closely approach one another. In certain embodiments, the distance between nanoparticles may be, e.g., about 0.5-5 nm. To allow close packing of the nanoparticles, the functional agents are preferably short, at about 0.5-3 nm. Depending on the time of exposure, the concentration of nanoparticles in the delivery medium, the degree and type of activation, and the degree and type of nanoparticle functionalization, the quasi monolayer may deviate from a maximally close packed array and assume a more sparse distribution on the activated surface.

The quasi monolayer of nanoparticles may refer to either or both of the deposited nanoparticles with functional groups and the deposited nanoparticles without functional groups (i.e., after the groups have been removed from the deposited particles). As suggested, depending upon the size, shape, flexibility, and distribution of the functional groups, the nanoparticles in the quasi monolayer may be limited in how close they approach one another (at least how close the individual metal centers of the nanoparticles approach one another). Normally, the metal cores will not touch one another. Thus, the filling factor for each quasi monolayer of nanoparticles is less than 100%. The filling factor of each layer may be 10-80%, and more specifically, may be 20-50%. The effective thickness for each layer, given the nanoparticle sizes of 1-10 nm, may be 0.1-0.8 nm, and more specifically, may be 0.2-5 nm. Given the preferred nanoparticle sizes of 2-5 nm, the effective thickness may be 0.2-4 nm, and more specifically, may be 0.4-2.5 nm.

Depending on the metal cap layer thickness requirement, the nanoparticle deposition may be repeated to achieve a desired nanoparticle thickness. See block 109 of FIG. 1. Thus, the operations indicated at blocks 105 and 107 of FIG. 1 may be repeated multiple times as indicated by the iterative loop and decision block 109 in FIG. 1. The total number of deposition cycles to reach a desired nanoparticle thickness may be more than one, specifically 1-20 cycles, preferably 1-10 cycles, more preferably 1-5 cycles, and even more preferably 2-4 cycles. Generally, a reduced number of cycles would reduce process time and increase efficiency and is therefore preferred.

In this embodiment, the substrate surface is activated with a polymer layer precursor to form the polymer overlayer (operation 105) and then coated with functionalized nanoparticles, which are attached to the polymer overlayer by exposing the substrate to a functionalized nanoparticle solution (operation 107). The substrate may optionally be dried between deposition of each successive layer of functionalized nanoparticles.

After a sufficient nanoparticle thickness is reached, the substrate is dried. Next, the nanoparticle ligands and possibly organic molecules used to treat the surface are removed from the substrate. See block 111 of FIG. 1. In other words, the molecules removed may include the functional agents on the nanoparticles, as well as the activating chemical, and the hydrophilic compound. FIG. 2E shows the substrate after the removal, with only nanoparticles 215 remaining on top of the metal features 203. The organic molecules may be removed by exposing the substrate to a reducing plasma, such as a hydrogen plasma. Other means of removal include, e.g., thermal energy and radiant energy. The plasma, heat, radiation, or a combination of two or more these breaks the bonds in the organic molecules and/or the bonds between the molecules and the metal. The by-product gases are then removed from the substrate.

In the depicted embodiment, the substrate is then optionally annealed. See block 113 of FIG. 1. While the specific physical effect of the annealing operation depends on the annealing conditions and the nanoparticle composition, in certain embodiments the annealing serves to wet the nanoparticles 215 with the metal from the underlying metal feature. This produces a "composite" cap layer material as described more fully below. As shown in FIG. 2F, the metal, usually copper, diffuses up to surround the nanoparticles 215. In some embodiments, the nanoparticles effectively "sink" a little in a phenomenon known as "burrowing' of the nanoparticles. For example, a large difference in the surface energy exists between cobalt nanoparticles and copper. The difference in surface energy drives copper diffusion into the nanoparticle quasi monolayer. A total free energy is reduced by exchanging the cobalt air interface above the surface with a cobalt copper interface below the surface without increasing the total surface area. A composite layer of cobalt nanoparticles surrounded by copper results. In certain specific embodiments, this composite layer has a thickness of about 1-10 nm from the dielectric barrier boundary and includes nanoparticles surrounded by the metal of the interconnect, usually copper. In certain embodiments, the composite layer includes at least about 20 to 80% atomic of copper and the remainder the nanoparticle material. In certain embodiments, the composite layer includes about 50% copper.

In another embodiment, the nanoparticles may wet the metal surface. During the anneal, the nanoparticles may melt and wet the underlying metal surface to form a pure layer of the second metal. The temperature at which the nanoparticles melt would be lower than the bulk melting temperature due, again, to the large surface to volume ratio for the nanoparticles. In certain embodiments, both wetting processes may occur such that the first and second metals wet each other, forming a metal cap layer with a gradient of material compositions.

In certain embodiments, the anneal temperature may be about 100 to 450 degrees Celsius, preferably about 300 to 400 degrees Celsius. The anneal may occur in the same chamber or even the same station as the organic molecule removal step. In some cases, the two operations merge into one; e.g., operations 111 and 113 of FIG. 1 combine into one operation. In some cases, the anneal may occur just before the dielectric barrier layer is deposited, which may occur in the same process chamber or station. The anneal temperature may be maintained from about 5 seconds to 5 minutes, depending on the thickness of the composite layer and the density of the nanoparticles. The temperature may be maintained by a controlled-temperature pedestal, on which the substrate will anneal. Additionally, infrared or UV radiation and/or a plasma may be used to heat the substrate to the specified temperature. Of course, more than one heat source may be used together for the anneal.

FIG. 2F shows the composite layer after annealing. Note that the composite layer may be slightly raised relative to the dielectric surrounding it. The composite layer may be raised because the nanoparticles are selectively deposited onto the metal surface and not onto the dielectric. As a result there is additional material on the metal lines that was not present immediately after planaraization. The nanoparticle/metal intermixing remains confined to the same metal line shape.

Figure 2G:
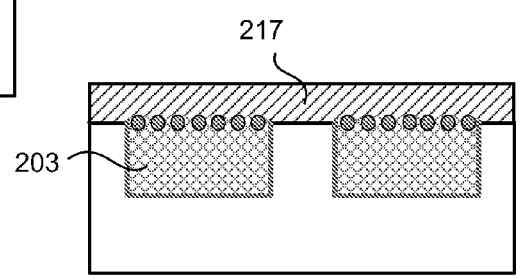
Figure 2D:
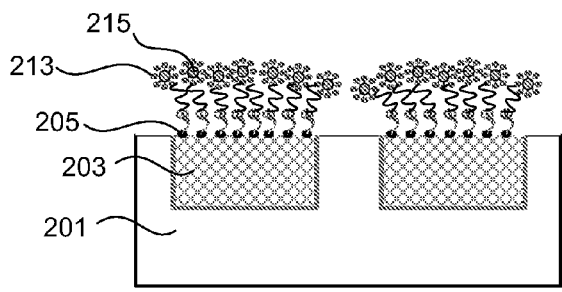

After the metal cap layer is formed, a dielectric diffusion barrier layer 217 may be deposited onto the substrate, as shown in FIG. 2G. See block 115 of FIG. 1. The dielectric diffusion barrier 217 may also serve as an etch stop during subsequent damascene processing. This layer should be mechanically strong and should be capable of protecting the underlying dielectric layer and effectively prevent diffusion of metal into the dielectric layer above. Layer 217 may be, for example, a carbide, oxide, boride, nitride, etc. such as SiNH, SiCH, SiCNH, SiCOH, SiOCH, SiBNH, SiBCH, SiBCNH, SiBCOH, SiONH, SiONCH, or combinations thereof; and may be about 100-1500 angstroms thick. As discussed above, having a metal cap layer may reduce the thickness requirement of the barrier layer. A thinner barrier layer would reduce the overall dielectric constant for the layer and is therefore preferred. The metal cap layer of the present invention may reduce the dielectric barrier layer thickness requirement to 0-10 nm. These materials can be deposited on a semiconductor substrate having exposed layers of dielectric and exposed metal lines by a number of methods, including plasma enhanced chemical vapor deposition (PECVD), chemical vapor deposition, such as thermal CVD or low pressure CVD (LPCVD) and spin-on methods. Of these methods, PECVD having a low frequency plasma component, provided by low frequency radio-frequency (LFRF) power source, is generally preferred.

After the dielectric diffusion barrier layer is deposited, the substrate undergoes further conventional copper damascene processing to build up a desired number of metallization layers, any number of which may employ a capping layer. In any given metallization layer, a dielectric layer may be deposited, followed by etching, depositing of a metal barrier layer, electroplating of copper, and planarizing. The metal cap deposition process may then start again.

In an alternative embodiment, a single chemical agent may be used in one step for both the rendering the metal surface hydrophilic and activating the surface. In other words, the chemical agent may be used for both operations 103 and 105. In this alternative embodiment, a double ended chemical with one end having an affinity for the metal surface and the other end with an affinity for the functional agent (ligand) or the nanoparticle surface may be used. For example, certain alkanedithiols may serve as such a chemical agent. The thiol groups have an affinity for transition metal surfaces. One terminal thiol group would attach to the metal surface and the other to the functional agents on the functionalized nanoparticles. In some cases, the exposed terminal thiol group may attach directly to nanoparticles by exposing the substrate to concentrated particle solution.

In other embodiments, the modified surface needs not to be hydrophilic. For example, a SAM-forming compound can be one that makes the surface hydrophobic. By selecting an organic molecule containing ends having desired affinities, the surface properties may be modified in a number of ways to enhance nanoparticle selectivity. Additionally, the same technique may be used for the exposed dielectric surface instead of the exposed metal surface. A SAM may be formed on the dielectric by selecting appropriate SAM-forming compounds. The dielectric can be made more hydrophobic to enhance hermeticity in subsequent processing. The hydrophobic surface property can also be exploited for silicon oxide nanoparticle deposition having functional groups that would bond to such surface. For example, a methacrylate ester-functional silane can be used to selectively attach SiC to the dielectric surface. One skilled in the art would be able to design processes that utilize the concepts disclosed herein to deposit a variety of nanoparticles onto a semiconductor substrate.

Metallization Stack

After the nanoparticle deposition and sintering, a unique metallization stack is formed. One embodiment of the stack is as shown in FIG. 2F. The stack includes first metal lines 203 embedded in dielectric 201 and one or more metallic cap layers. The first cap layer may be a composite layer of the first metal and a second metal. The first metal may be copper or aluminum. As shown in FIG. 2F, the second metal may be derived from nanoparticles 215. Examples of the second metal include cobalt, ruthenium, nickel, platinum, palladium, gold, tungsten, titanium, titanium nitride or alloys thereof. For many applications, the second metal is cobalt, ruthenium, or an alloy of either one. Because of nanoparticle deposition technique, the composite metallic cap layer may include one or more quasi monolayers of metallic nanoparticles 215. The annealing process causes the particles to become intermixed with the first metal 203, usually copper.

As indicated above, the nanoparticles as deposited may have a diameter of 1-10 nm, preferably 2-5 nm and may be atom clusters of about 50-1000 atoms. In the composite metallic cap layer they may maintain this size or they may be reduced in size as some of the metal diffuses or dislodges into the first metal. The nominal thickness of the composite cap layer may be about 1-30 nm, which includes the interstitial areas filled by the first metal. In certain embodiments, the thickness of the composite cap layer is about 1-20 nm, or about 1-10 nm, or even more preferably about 5-10 nm. This thickness may be viewed as encompassing the region from the top of the line (including the cap layer) down into the line to a point where the concentration of the second metal (the metal contributed by the nanoparticles) becomes negligible. If the distribution of nanoparticles on the surface is relatively sparse, such that gaps in the second metal exist on the surface of the cap layer, the thickness may be viewed as an effective thickness which accounts for the percentage of the surface occupied by nanoparticles. In certain embodiments, the composite layer includes about 20 to 80% atomic of copper and the remainder the nanoparticle material. For example, the composite layer may include about 50% copper and 50% nanoparticles. The composite layer may also include an alloy of the second metal with boron and/or phosphorous. The alloy may include 0-20 atomic % of boron and 0-20 atomic % of phosphorus.

In another embodiment, the capping layer would include a pure or almost pure layer of the second metal derived from the nanoparticles wetting the first metal surface. In one embodiment, the capping layer includes the second metal at 99% or greater atomic. In certain embodiments, the capping layer would comprise of two layers: one having a pure or almost pure layer of the second metal and another as a composite of the first and second metal. In other embodiments, the composition difference between the two layers may be a gradient instead of two distinct layers wherein the first metal composition decreases toward the overlying dielectric layer.

Implementation Options

Although the foregoing embodiment is discussed using the hydrophobic/hydrophilic surface properties of metals inlaid in dielectric as an example of the selective nature of the nanoparticle deposition using the methods of the present invention, other surface properties may be exploited using the present invention. In various embodiments, the present invention employs a substrate with a heterogeneous surface such that portions of the substrate would accept deposition of nanoparticles to differing degrees.

In some embodiments, the acidity or alkalinity (pH) of a surface portion may provide the necessary deposition selectivity. In other embodiments, the conductivity of surface portions may provide the selectivity. This may be the case when deposition is facilitated by an electron transport mechanism (e.g., electroless or electrolytic deposition). In still other embodiments, the surface roughness of some portions may provide the necessarily selectivity. A subsequent washing operation may facilitate removal of the unbound nanoparticles from certain portions of the substrate.

In the embodiments described above, the surface of certain portions of the substrate is modified to enhance the selectivity by, for example, making the portions more or less hydrophilic or hydrophobic. In other cases, the surface of a heterogenous substrate need not be modified at all. Its inherent surface properties may be sufficiently accepting or not accepting of nanoparticle deposition without any modification to ensure the necessary selectivity.

If the surface property is to be modified, a number of reagents, in addition to the ones discussed in the example embodiment above, may be used to achieve this modification. For example, an anticorrosion agent such as BTA may be used to modify the substrate surface properties.

In many cases, a surface modifying reagent is a bifunctional reagent containing one group or terminus that selectively adheres to one region of the substrate and another group or terminus that selectively adheres to nanoparticles as deposited (or to a separate activating group if used). For metal regions of a substrate, the one terminal group may be a thiol or a amine containing reagent.

For the non-substrate terminal group, its properties depend entirely on the type of functional agent (ligand) on the nanoparticle (or the surface activating agent if used). Often for aqueous delivery of nanoparticles, the terminal groups of the nanoparticle ligand and the bifunctional reagent will be polar/ hydrophilic groups such as a carboxylic acid, an ammonium ion, a thiol, an amine, a phosphonate, a sulfonate, a heterocycle (e.g., 3-6 member rings such as thiophenes, azoles, pyrans, oxetanes, furans, and pyrroles), etc.

In some embodiments, the bifunctional reagent includes a linker portion connecting the two terminal groups. The linker portion of a bifunctional reagent may be a hydrocarbon chain such as an alkane, alkene, or alkyne chain. Examples of alkane chains include 5-20 carbon linear chains such as hexane, septane, octane, dodecane, and octadecane. Limited branching may be present in some linkers. The length of the bifunctional agent may affect the extent to which the bifunctional molecules self-align on the substrate. Additionally, longer, more flexible bifunctional agents may bond to the substrate at both ends.

In certain embodiments, activating agents or chemicals may be used in conjunction with a bifunctional surface reagent. This may be the case when the bifunctional reagent does not directly interact with the nanoparticles and instead serves as a site for deposition of an activating agent. Specific examples of activating agents are poly lysine and poly acrylic acid. These activating agents bond to the non-substrate terminal group of the bifunctional reagent and to the functional agents on the nanoparticles. It should be understood that the invention is not limited to embodiments employing activating agents. In some cases, the functional agents of the nanoparticles may bond directly to the bifunctional reagent or an unmodified surface.

Although the foregoing embodiment is discussed forming a metal capping layer, other materials may be formed using the present invention. For example, non-metal nanoparticles such as dielectric nanoparticles (e.g., silicon dioxide, silicon carbide or silicon nitride, aluminum oxide nanoparticles) may be used to form layers. In a typical example, a metal nanoparticle may have a diameter of about 1-50 nm, preferably about 1-10 nm, or more preferably about 2-5 nm. The activating agents in this case might be silanes, difunctional organic agents or fatty acids.

The nanoparticles may or may not be functionalized with ligands (functional agents) chosen to bind with a region of the substrate surface that may or may not have been itself functionalized. In one embodiment, nanoparticles without functional groups are deposited onto a functionalized substrate. In other embodiments, functionalized nanoparticles may be deposited selectively onto an unmodified substrate surface having an intrinsic affinity for the functional agents. In still other embodiments, the ligands may be a functional mirror image of the bifunctional reagent used to modify the surface region. For example, the ligand may include one terminal group having an affinity for a metal core of the nanoparticle (e.g., a thiol, a rigid phosphate or an isonitrile). The other terminal group will have an affinity for the layer surface region to which the nanoparticles are to bind. Examples include the polar/hydrophilic groups listed above.

The nanoparticles may be delivered in a variety of mediums. Although aqueous mediums have been discussed, other mediums are possible depending on surface property of the layer surface region to which the nanoparticles are to bind. For example, a non-aqueous medium may be used to deposit certain types of nanoparticles (e.g., silicon dioxide nanoparticles). In the liquid medium, the nanoparticles may be in suspension or solution, depending on the interactions between the medium and the nanoparticles and/or the functional agents. The concentration of nanoparticles in the medium is preferably controlled to maintain uniformity from substrate to substrate. In addition to dispensing a liquid, an aerosol or a vapor delivery vehicle may also be used to deposit the nanoparticles. The deposition should deposit the nanoparticles, in whatever medium chose, uniformly across the wafer without wasting too much material. For example, preferably 50% or more of nanoparticle material is deposited onto a substrate at each dispensing operation.

In some embodiments, more than one type of nanoparticles may be deposited in the same operation or in different operations. For example, deposition onto a substrate having hydrophilic and hydrophobic regions may be made in successive operations where one operation deposits nanoparticles having functional agents that bind to a hydrophilic surface and another operation deposits nanoparticles having functional agents that bind to a hydrophobic surface. Additional, the heterogeneous nature of the substrate is not necessarily limited to two kinds of surfaces. Nanoparticles may be deposited onto three or more different surface regions each having different affinity for various functional agents. Deposition onto more than two different surface regions may comprise of one, two, or more separate deposition operations.

In another embodiment, the functional agents are chosen such that remaining ligands will alloy with the capping material. For example, the use of phosphorous or boron containing ligands will incorporate phosphorous and/or boron into the capping layer and improve the barrier properties of the capping layer. In some cases, the metallic capping layer with boron and/or phosphorous eliminates the need for a dielectric capping (barrier) layer.

Apparatus

Figure 3:
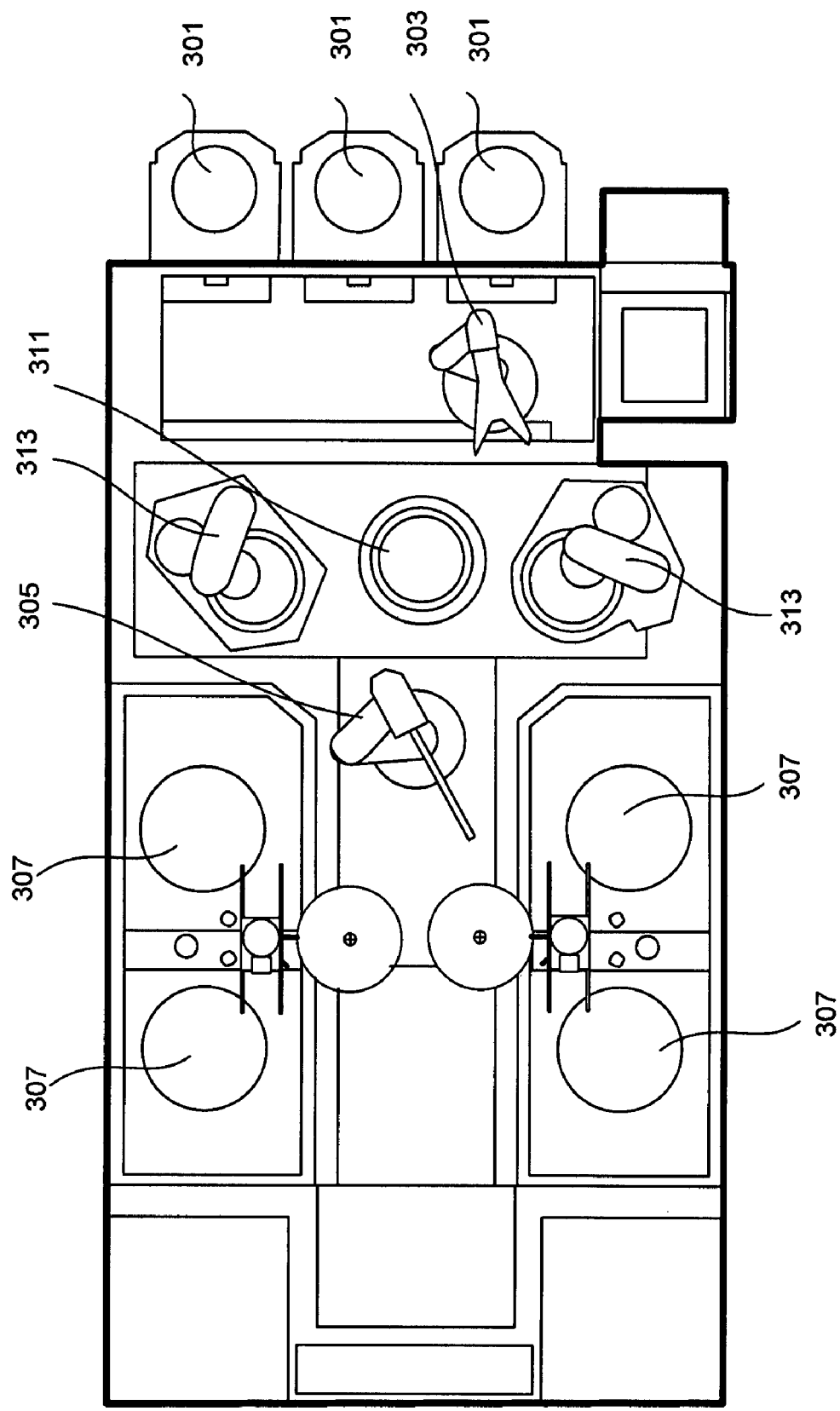
FIG. 3 is a semiconductor processing apparatus suitable to practice certain embodiments in accordance with the present invention.

One or more operations of the present invention may be implemented in one or more conventional or commercially available semiconductor processing tools with little or no modification to the hardware and no additional footprint in the semiconductor fabrication plant. Alternatively, a custom apparatus may be designed to carry out the wet processing operations. Regardless, various types of wet processing tools may be suitable for performing operations 103 (rendering a surface hydrophilic), 105 (activating the surface), and 107 (depositing nanoparticles), such as CMP, ECMP, grinding, lapping, buffing, electroplating, electroless plating, or etching tools. Particularly, operations 103, 105, and 107 are suitable for a wet processing tool such as a CMP or an ECMP tool as depicted in FIG. 3. In one embodiment using the depicted apparatus, a substrate is initially planarized in one of CMP processing stations 307. Thereafter, the substrate is moved to a cleaning station 311 by robot 305. The cleaning station 311 may also serve as a nanoparticle deposition station. In certain embodiments, station 311 may include a spin platform configured to hold and spin a substrate and a first delivery mechanism (e.g., one including a dispensing nozzle) configured to dispense liquids on to the surface of the substrate. The liquids may contain (1) a functionalizing reagent (e.g., a SAM-forming compound) to render the surface hydrophilic, (2) an activating chemical such as a polymer or polymer precursor, (3) functionalized nanoparticles, (4) deionized water, (5) a passivating agent, (6) a mild acid, and/or (7) a mild base. The dispenser may be coupled to a number of storage containers via liquid lines, valves, and pumps. One skilled in the art will appreciate that many different dispensing system designs can be employed. Generally these will be able to select among several liquid sources and dispense a set amount of liquid onto the substrate.

In another embodiment, the nanoparticle deposition station may be the spin/rinse/dry stations 313 of a CMP apparatus. Stations 313 may also include a spin platform and a first dispensing mechanism including, e.g., a nozzle configured to dispense various liquids. In this embodiment, the substrate may be moved from station 311 after cleaning to one of the stations 313 by the front-end robot 303 or the back-end robot 305. After the nanoparticle deposition is completed or after each deposition iteration, the substrate may be rinsed with DI water or a mild cleaner and dried. A second dispensing mechanism (e.g., a nozzle) may dispense a drying vapor onto the surface of the substrate as it spins to facilitate the drying process. In some instances, the same nozzle may dispense both liquid and vapor. After the substrate is dried, the front-end robot 303 may move the substrate to one of the substrate storage stations 301, which may be a Front opening unified pod (FOUP) module.

In certain embodiments, the wet processing tool will include a controller configured to execute a set of instructions that control deposition of the one or more layers of functionalized nanoparticles. The instructions may include computer code for (a) depositing one or more surface treatment agents on a substrate (e.g., code directing the apparatus to deposit a reagent for rendering exposed copper hydrophilic and/or code for directing the apparatus to deposit a reagent for activating the copper to accept functionalized nanoparticles), (b) depositing one or more layers of functionalized nanoparticles on the substrate, (c) repeating the deposition of surface treatment agents and functionalized nanoparticles until a desired thickness is reached (if necessary), and (d) rinsing and/or drying the substrate. As explained, examples of the surface treatment agents include anticorrosion agents, surface property modifying reagents, or activating reagents. The code may direct delivery of these reagents from particular reservoirs through designated lines and nozzles onto a substrate. The code may control timing of the delivery of various reagents and other wet process operations for sequential or parallel processing. Thus, for example, the instructions may specify depositing an additional surface treatment agent before each of the iterative nanoparticle deposition operations as well as optional rinsing and cleaning the substrate before drying.

Suitable semiconductor processing tools to implement these operations may be the Sabre electrodepositon tool from Novellus Systems of San Jose, Calif., Exceda CMP tool from Novellus Systems of San Jose, Calif. or the Mirra and Mirra-Mesa from Applied Materials of Santa Clara, Calif. One skilled in the art would be able to configure many of the existing wet processing tools to perform these operations. For a process utilizing a plasma or reducing gas surface treatment before nanoparticle deposition, some modification may be required to these semiconductor processing tools to include an enclosed chamber capable of forming plasma or contact the substrate with forming gas. Optionally, the substrate may be transferred between one or more tools to perform the operations 103, 105, and 107.

The remaining operations of the nanoparticle deposition method also may be performed in one or more existing semiconductor dry processing tools with little or no modification to the hardware and no additional footprint in the semiconductor fabrication plant. Alternatively, a custom apparatus may be designed to carry out the dry processing operations. A suitable tool may be one used for dielectric deposition such as a PECVD, LPCVD or an HDP CVD tool. The dry processing tool includes one or more substrate caches, one or more chambers, and one or more robots. Each chamber may contain one or more processing stations configured to deposit a dielectric or to remove organic molecules from a substrate. Each station includes a controlled-temperature substrate holder, at least one electrode configured to generate a plasma, and at least one gas injection port.

Figure 4A:
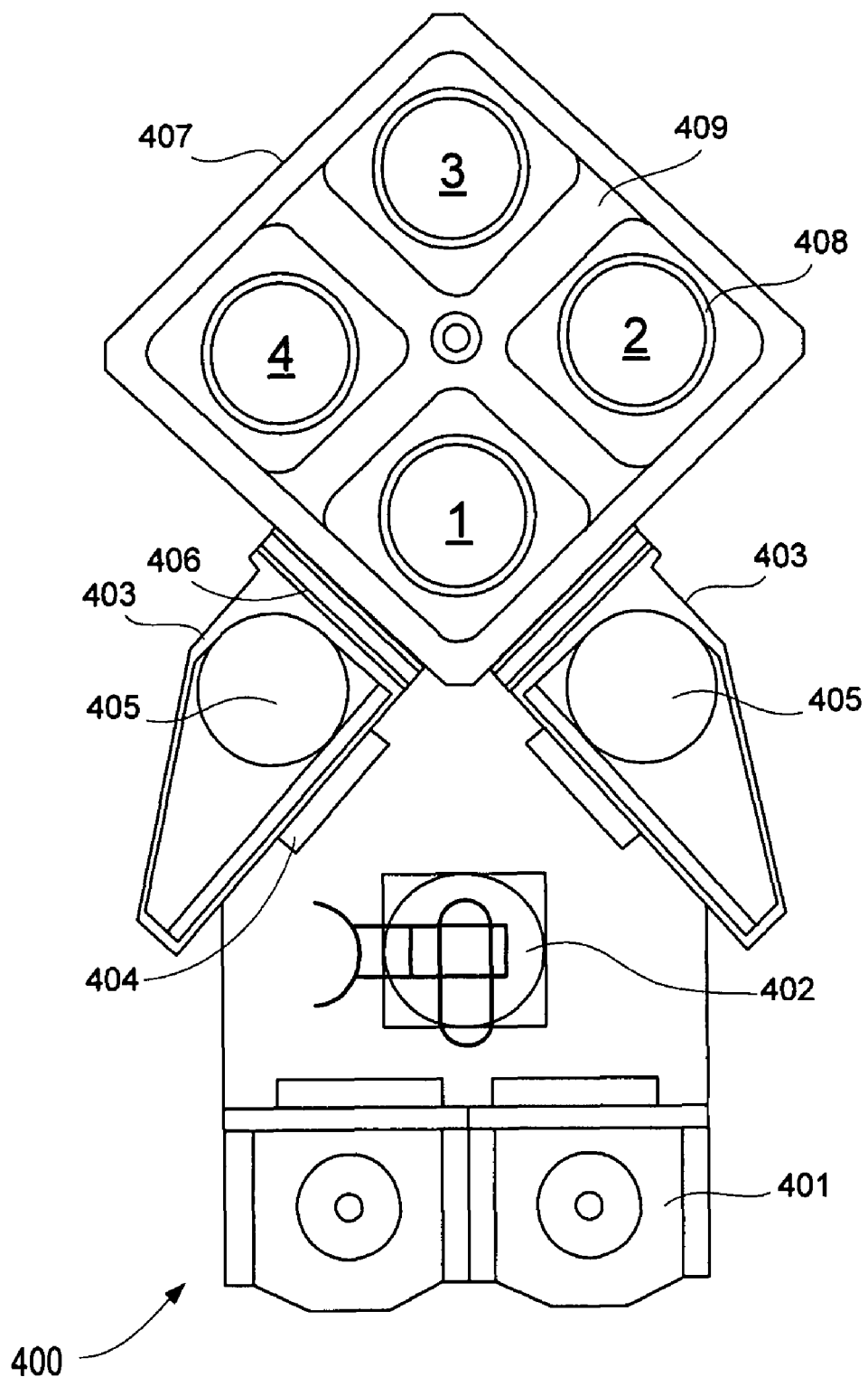
FIGS. 4A-B are semiconductor processing apparatuses suitable to practice certain embodiments in accordance with the present invention.

An example of a suitable tool is depicted in FIG. 4A. In this example, a substrate having deposited functionalized nanoparticles enters the tool from a cassette loaded through a pod 401, such as the front opening unified pod (FOUP) used in 300 mm substrate systems. A robot 402, at atmospheric pressure or a reduced pressure environment, moves the substrate from the cassette to one of two load locks 403. The substrate is placed on a loadlock pedestal 405. The substrate enters the loadlock through a valve 404 and is placed on a loadlock pedestal 405. The valve 404 to the atmospheric environment then closes; and the loadlock 403 is pumped down to reduce the pressure to that of the reactor 407. The substrate is centered and aligned in the loadlock on the pedestal 405. Then a slit-valve 406 to the reactor 407 opens, and another robot (not shown) places the substrate into the reactor on a pedestal of a first station in the reactor.

The reactor 407 in the depicted embodiment has four stations, numbered from 1 to 4. Each station has a pedestal 413 and showerhead (not shown). Each station is capable of performing a process step simultaneously with the other stations. The substrate is indexed through the reactor stations via a carrier ring 408 and a spindle 409. At the end of each step, the substrate, sitting on the carrier ring 408, is indexed to the next station for further processing. At the end of processing, the substrate is returned to station 1. The substrate then leaves the reactor through a slit valve 406 to a loadlock 403, where the substrate is cooled on the cooling pedestal 405 before finally returning to the cassette in the pod 401.

At station 1, the functional agents are removed from the deposited layer(s) of functionalized nanoparticles. Along with the functional agents, any activating chemical and/or hydrophilic compounds may be removed. This removal is accomplished by exposing the substrate to a reducing plasma, ultraviolet radiation, and/or heat. Of course, a combination of two or more of these may be used at the same time. Station 1 preferably includes a plasma source so that a reducing plasma may be applied to the substrate. The reducing plasma may be formed by using hydrogen or forming gas. Concurrently or in series, ultraviolet radiation and heat may be applied to the substrate to remove the organic molecules. For example, UV radiation may be applied in the loadlock 403 prior to plasma treatment and heat may be applied to the substrate through a heated pedestal or a controlled-temperature pedestal. The pedestal temperature may vary among the loadlock and different stations.

Exposing the substrate to plasma and/or radiation may remove the organic molecules or ligands by breaking the bonds between the molecules/ligands and the metal. For example, an electrostatic or covalent bond between the hydrophilic compound and the exposed metal line may be thus broken. Further, bonds between the functional agent and the nanoparticles and bonds between the functional agents and the polymer overlayer surface may also be broken. Still further, internal bonds in the organic moieties may be broken. The decomposition products are typically volatile and easily removed by vacuum. In some embodiments, the pertinent bonds may be broken by ion bombardment of the substrate surface. The pedestal may be electrically biased to draw the plasma toward the substrate surface. The plasma may be generated using heavier gas such as argon or nitrogen for these embodiments so as to increase the force of the ion impacts.

After the organic components are removed, the substrate may stay at station 1 or be transferred to station 2 for the anneal operation. During annealing, the metal from the exposed metal lines diffuses to wet the nanoparticles through capillary action. The substrate may be heated to about 100-300 degrees Celsius for about 5 seconds to 5 minutes, depending on the density of the nanoparticles and the thickness of the metal cap layer. The annealing operation occurs just before a dielectric barrier layer is deposited onto the substrate. The deposition may occur in stations 2, 3, and 4. After the dielectric barrier deposition, the substrate is removed and cooled before subsequent metallization layers are added.

The dry processing apparatus may also include a controller configured to execute a set of instructions to modify the composite metal cap layer. In certain embodiments, the instructions may include timed instructions to (a) remove functional agents from a substrate containing deposited functionalized nanoparticles, (b) anneal the substrate to form a composite layer, and/or (c) deposit a barrier dielectric layer onto the substrate. The instructions may specify certain sequential and/or parallel operations. Instruction to remove functional agents may include instructions to apply a reducing plasma and heat, to apply UV radiation and heat, and/or to apply heat to a substrate containing deposited functionalized nanoparticles so that the functional agents and other organic molecules may be removed. The instruction to apply plasma may also include instructions to apply bias power to the pedestal or other wafer support to draw the plasma toward the substrate. The operations specified by these instructions may be executed in different chambers or in the same chamber. If executed in different chambers, instructions may also include instructions to transfer substrates from one chamber to another. If executed in the same chamber having more than one stations, instructions may also include instructions to transfer substrates from one station to the next.

Figure 4B:
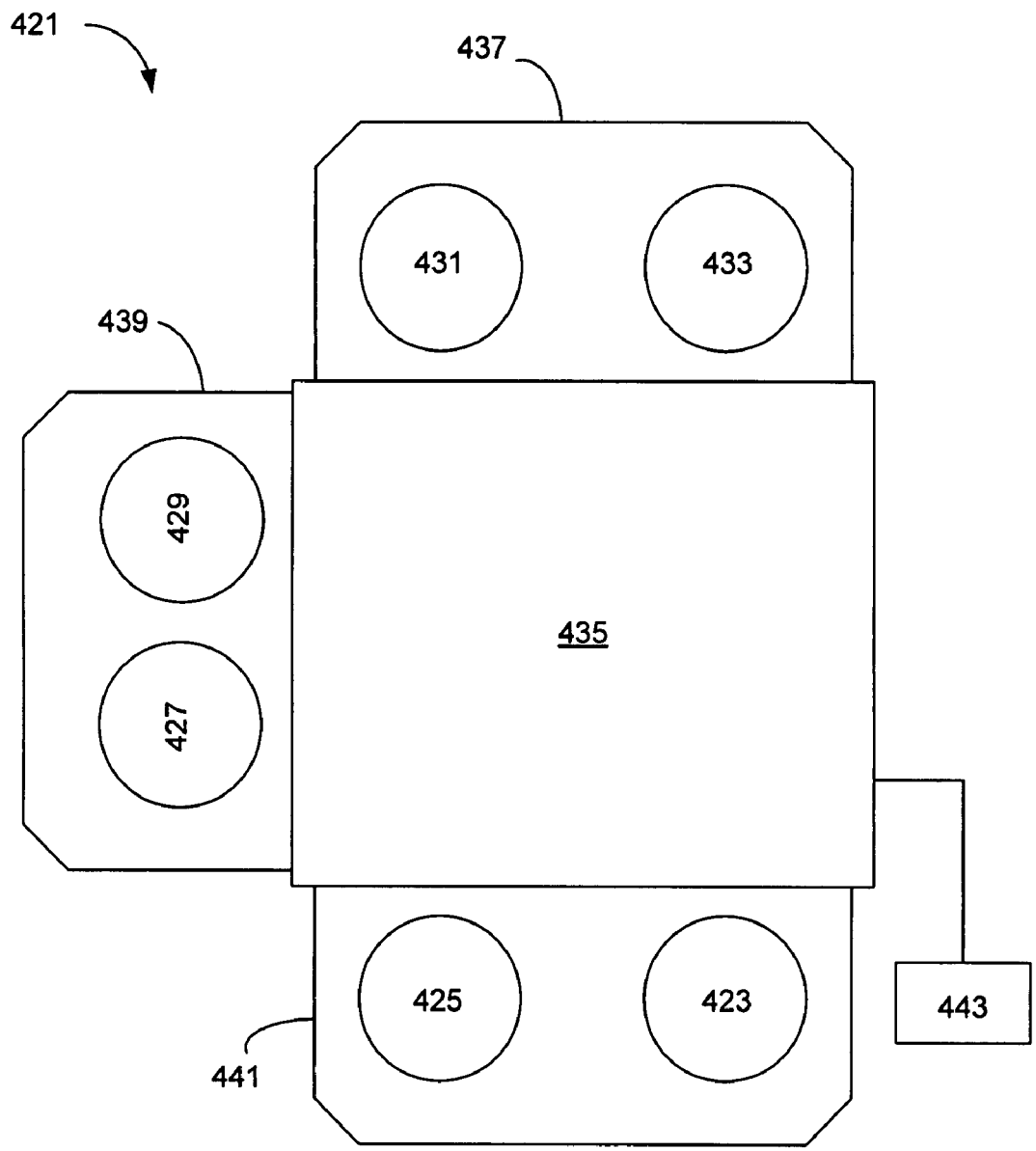

In some embodiments, a processing tool having more than one dry processing chamber may be used. One example of such multi-station apparatus is illustrated in FIG. 4B. The example multi-station apparatus 421 includes six stations 423, 425, 427, 429, 431, and 433 residing in three separate processing chambers 437, 439, and 441, with two stations residing in each chamber. A robot-containing chamber 435 adjacent chambers 437, 439, and 441 provides a mechanism for loading and unloading the substrates into the stations. A controller 443 provides instructions for operation of a multi-station apparatus 421. Individual stations within one chamber are isolatable from each other and may carry out identical or different operations. In one embodiment, two substrates are simultaneously transferred to stations 423 and 425 residing in one chamber 441 and simultaneously undergo identical operations including removal of organic molecules. After this process is completed, the two substrates are removed from the chamber 441, and are simultaneously introduced to stations 427 and 429 residing in chamber 439. In this chamber, the substrates may be sintered or annealed to form the composite metal layer and, optionally, receive a deposited barrier diffusion layer. The substrates are then removed from chamber 439, and are introduced to stations 431 and 433 residing in chamber 437, where further barrier or dielectric deposition may follow. Although an example apparatus with three chambers and two stations in each chamber is discussed, other similar apparatuses may be used. For example, an apparatus with two or four chambers and one or two stations in each chamber may be used.

Thus, as described with reference to FIG. 4B, a composite metal cap layer may be prepared in a multi-chamber apparatus with different subprocesses performed in different chambers. Each chamber may have one, two, or more stations. Each chamber may be capable of removing the organic molecules, annealing, or depositing the dielectric barrier layer. Of course, more than one of these operations may be performed in the same chamber. For example, the substrate may enter chamber A for removal of the organic molecules, chamber B for annealing, and chamber C for the dielectric barrier deposition. One skilled in the art would be able to configure many of the dry deposition processing tools available to performed these operations. Suitable tools may be the Vector and Speed available from Novellus Systems of San Jose, Calif. and the Producer and Centura available from Applied Materials of Santa Clara, Calif.

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

What is claimed is:

1. A semiconductor metallization stack comprising:
    (a) a metallization layer comprising metal lines of a first metal inlaid in a dielectric; and
    (b) a metallic cap layer comprising the first metal and a second metal, wherein the metallic cap layer comprises a region from a top boundary of the metal lines into a level 1-30 nanometers below a top boundary of the metal lines and within said region of the metallic cap layer, the concentration of the first metal is between about 5% and 70% atomic.

2. The semiconductor metallization stack of claim 1, further comprising a second metallic cap layer comprising nanoparticles of the second metal wherein the concentration of the second metal is about or greater than 99% atomic, wherein the second metallic cap layer is disposed on top of the metallic cap layer of (b).

3. The semiconductor metallization stack of claim 1, wherein the first metal is copper.

4. The semiconductor metallization stack of claim 1, wherein the second metal comprises nanoparticles embedded in the first metal.

5. The semiconductor metallization stack of claim 4, wherein the nanoparticles are clusters of about 50-1000 metal atoms.

6. The semiconductor metallization stack of claim 4, wherein the nanoparticles comprise nanoparticles of one or more of cobalt, ruthenium, nickel, platinum, palladium, gold, tungsten, titanium, titanium nitride or alloys of these.

7. The semiconductor metallization stack of claim 1, wherein the second metal comprises nanoparticles about 2-5 nm in size.

8. The semiconductor metallization stack of claim 1, wherein the second metal comprises
    (a) nanoparticles of cobalt, ruthenium, nickel, platinum, palladium, gold, tungsten, titanium, titanium nitride or alloys of these and,
    (b) boron, phosphorous, or both boron and phosphorous.

9. The semiconductor metallization stack of claim 1, wherein the metallic cap layer impedes electromigration of the first metal during operation of a semiconductor device comprising said metallization stack.

10. The semiconductor metallization stack of claim 1, wherein the metallic cap layer acts as a shunt around voids in the first metal.

11. The semiconductor metallization stack of claim 1, further comprising a dielectric barrier layer disposed on top of the metallic cap layer.

12. The semiconductor metallization stack of claim 1, further comprising a dielectric layer disposed on top of the metallic cap layer.

13. The semiconductor metallization stack of claim 1, wherein the metallization layer further comprises a metal barrier layer interposed between the first metal and the dielectric.

14. A semiconductor metallization stack comprising:
    (a) a metallization layer comprising metal lines of a first metal inlaid in a dielectric; and
    (b) a metallic cap layer comprising the first metal and a second metal, wherein the metallic cap layer comprises a region from a top boundary of the metal lines into a level 1-30 nanometers below a top boundary of the metal lines and within said region of the cap layer, the concentration of the first metal is a gradient between about 0% and about 70% atomic with the top surface having about 0% first metal.

15. The semiconductor metallization stack of claim 14, wherein the second metal comprises
    (a) nanoparticles of cobalt, ruthenium, nickel, platinum, palladium, gold, tungsten, titanium, titanium nitride or alloys of these and,
    (b) boron, phosphorous, or both boron and phosphorous.

16. The semiconductor metallization stack of claim 14, wherein the second metal comprises nanoparticles embedded in the first metal.

17. The semiconductor metallization stack of claim 16, wherein the nanoparticles comprise nanoparticles of one or more of cobalt, ruthenium, nickel, platinum, palladium, gold, tungsten, titanium, titanium nitride or alloys of these.

* * * * *